United States Patent
Hashimoto et al.

(10) Patent No.: US 8,192,194 B2
(45) Date of Patent: Jun. 5, 2012

(54) MOLD AND METHOD FOR MANUFACTURING THE SAME

(75) Inventors: Kazunobu Hashimoto, Kawasaki (JP); Tetsuya Imai, Ichihara (JP); Osamu Kasono, Iruma (JP); Masahiro Katsumura, Kawagoe (JP)

(73) Assignee: Pioneer Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/121,348

(22) PCT Filed: Jan. 29, 2009

(86) PCT No.: PCT/JP2009/051489
§ 371 (c)(1),
(2), (4) Date: May 9, 2011

(87) PCT Pub. No.: WO2010/086986
PCT Pub. Date: Aug. 5, 2010

(65) Prior Publication Data
US 2011/0272850 A1 Nov. 10, 2011

(51) Int. Cl.
B29C 59/02 (2006.01)
B29C 33/30 (2006.01)
G11B 5/84 (2006.01)

(52) U.S. Cl. ........ 425/385; 425/185; 425/411; 425/810; 264/1.33; 264/293; 977/887

(58) Field of Classification Search ................ 264/1.33, 264/293; 425/185, 385, 411, 443, 810; 977/887
See application file for complete search history.

(56) References Cited

U.S. PATENT DOCUMENTS

| | | | | |
|---|---|---|---|---|
| 6,302,674 B1 * | 10/2001 | Arakawa et al. | ........... | 425/192 R |
| 7,320,584 B1 * | 1/2008 | Harper et al. | ................. | 425/390 |
| 7,462,320 B2 * | 12/2008 | Ho et al. | ........................ | 264/334 |
| 2004/0149367 A1 * | 8/2004 | Olsson et al. | .................... | 156/64 |
| 2007/0020871 A1 * | 1/2007 | Chen et al. | ..................... | 438/401 |
| 2008/0075908 A1 * | 3/2008 | Kataho et al. | ................ | 428/64.4 |

FOREIGN PATENT DOCUMENTS

| | | |
|---|---|---|
| JP | 39-18971 | 7/1939 |
| JP | 39-18971 | 7/1964 |
| JP | 51-82380 | 7/1976 |
| JP | 5-16167 | 1/1993 |
| JP | 2001-035021 | 2/2001 |
| JP | 2006-40321 | 2/2006 |
| JP | 2006-175756 | 7/2006 |
| JP | 2008-155522 | 7/2008 |
| JP | 2008-221552 | 9/2008 |

* cited by examiner

*Primary Examiner* — Joseph Del Sole
*Assistant Examiner* — Ryan Ochylski
(74) *Attorney, Agent, or Firm* — Drinker Biddle & Reath LLP

(57) ABSTRACT

A mold is provided, at an outer circumferential region thereof, with portions to be gripped, to allow a transfer apparatus to perform transferring to an object. The portions to be gripped are formed in a different shape from the remaining portion of the outer circumferential region. For a mold set including two molds, each of the molds is provided, at an outer circumferential region thereof, with portions to be gripped, to allow the transfer apparatus to perform transferring to the object. The portions to be gripped are formed in a different shape from the remaining portion of the outer circumferential region. The portions to be gripped of one of the molds and the portions to be gripped of the other mold are disposed at different angular positions.

6 Claims, 7 Drawing Sheets

(a)

V-V CROSS SECTIONAL VIEW (b)

W-W CROSS SECTIONAL VIEW (c)

MOLD AND METHOD FOR MANUFACTURING THE SAME

TECHNICAL FIELD

The present invention relates to a mold having an uneven pattern to be transferred to a transfer layer in an object, such as a substrate, and a manufacturing method thereof.

RELATED ART

In a nano-imprint method that presses a mold having a micro pattern formed by electron beam exposure to a substrate, such as a wafer, having a resin material (resist) applied thereto to transfer the pattern to the resist, a circular or disk-shaped mold is generally used with respect to a circular or disk-shaped substrate, such as optical recording media or magnetic recording media (for example, see Patent Document 1).

In such a transfer method, a substrate having a transfer layer is held by a first holding unit, a mold is held by a second holding unit with a suction force, reference positions of the mold and the substrate are aligned with each other with a certain distance, and pressure is applied between the mold and the substrate so that the mold is pressed to the substrate, thereby transferring an uneven pattern of the mold to the surface of the substrate.

Patent document 1: Japanese Patent Application Publication No. 2006-040321

SUMMARY OF THE INVENTION

Problem(s) to be Solved by the Invention

In the transfer method disclosed in Patent document 1, the mold and the substrate are formed in the shape of a circle. When the mold is held by a mold holding part at the outer circumference of the mold, therefore, interference occurs between the mold holding part and the substrate. In the case of double-sided print, interference or undesired contact occurs between a holding part for an upper mold and another holding part for a lower mold and between the holding parts and the respective molds.

The present invention has been made in view of the above-described problems, and it is an object of the present invention to provide a mold, a mold set and a manufacturing method thereof that are capable of preventing the occurrence of interference between a mold holding part and an object, such as a substrate, when the mold is held at the outer circumference thereof and that are capable of preventing the occurrence of interference between an upper mold holding part and a lower mold holding part and interference between the holding parts and the respective molds in the case of double-sided print.

Solution for Solving the Problem(s)

A mold of the present invention according to one aspect of the invention is directed to a mold having a pattern to be transferred to a transfer layer formed on (in) one face of an object using a transfer apparatus. The mold is provided, at some locations of an outer circumferential region thereof, with portions to be gripped, which are gripped by the transfer apparatus so that the transfer is performed to the object, and the portions to be gripped have a different shape from the remaining portion of the outer circumferential region.

A mold set of the present invention according to another aspect of the invention is directed to a mold set including two molds having patterns to be transferred to transfer layers formed at opposite faces of an object using a transfer apparatus. Each of the two molds has portions to be gripped at an outer circumferential region thereof. The portions to be gripped are gripped by the transfer apparatus so that the transfer is performed to the object. The portions to be gripped have a different shape from the remaining portion of the outer circumferential region. The portions to be gripped of one of the molds and the portions to be gripped of the other mold are disposed at different angular positions.

A method of the present invention according to still another aspect of the invention is directed to a method of manufacturing a mold having a pattern to be transferred by a transfer apparatus. The manufacturing method includes a pattern forming step of forming a pattern on a mold blank and an outer form shaping step of forming portions to be gripped, which are gripped by the transfer apparatus so that transfer is performed to the object, at an outer circumferential region of the mold blank. The portions to be gripped are formed in a different shape from the remaining portion of the outer circumferential region.

According to an exemplary embodiment of the present invention, a mold is provided at the outer circumferential region thereof with the portions to be gripped, which are gripped by the transfer apparatus so that transfer is performed to the object. The portions to be gripped have a different shape from the remaining portion of the outer circumferential region. Therefore, it is possible to prevent interference, for example a collision, between gripping parts to grip the portions to be gripped and a substrate. According to another exemplary embodiment of the present invention, each of the two molds is provided at the outer circumferential region thereof with the portions to be gripped, which are gripped by the transfer apparatus so that transfer is performed to the object. The portions to be gripped have a different shape from the remaining portion of the outer circumferential region. The portions to be gripped of one mold and the portions to be gripped of the other mold are disposed at different angular positions. In the case of double-sided print, therefore, it is possible to prevent interference between gripping parts to grip the portions to be gripped of the upper mold and another gripping parts to grip the portions to be gripped of the lower mold, interference between any one of the gripping parts and a corresponding one of the molds or the substrate, or interference between the two molds.

BRIEF DESCRIPTION OF THE DRAWINGS

FIG. 7a is a plan view, FIG. 7b is a cross sectional view taken along the line V-V, and FIG. 7c is a cross sectional view taken along the line W-W.

Figure 1:
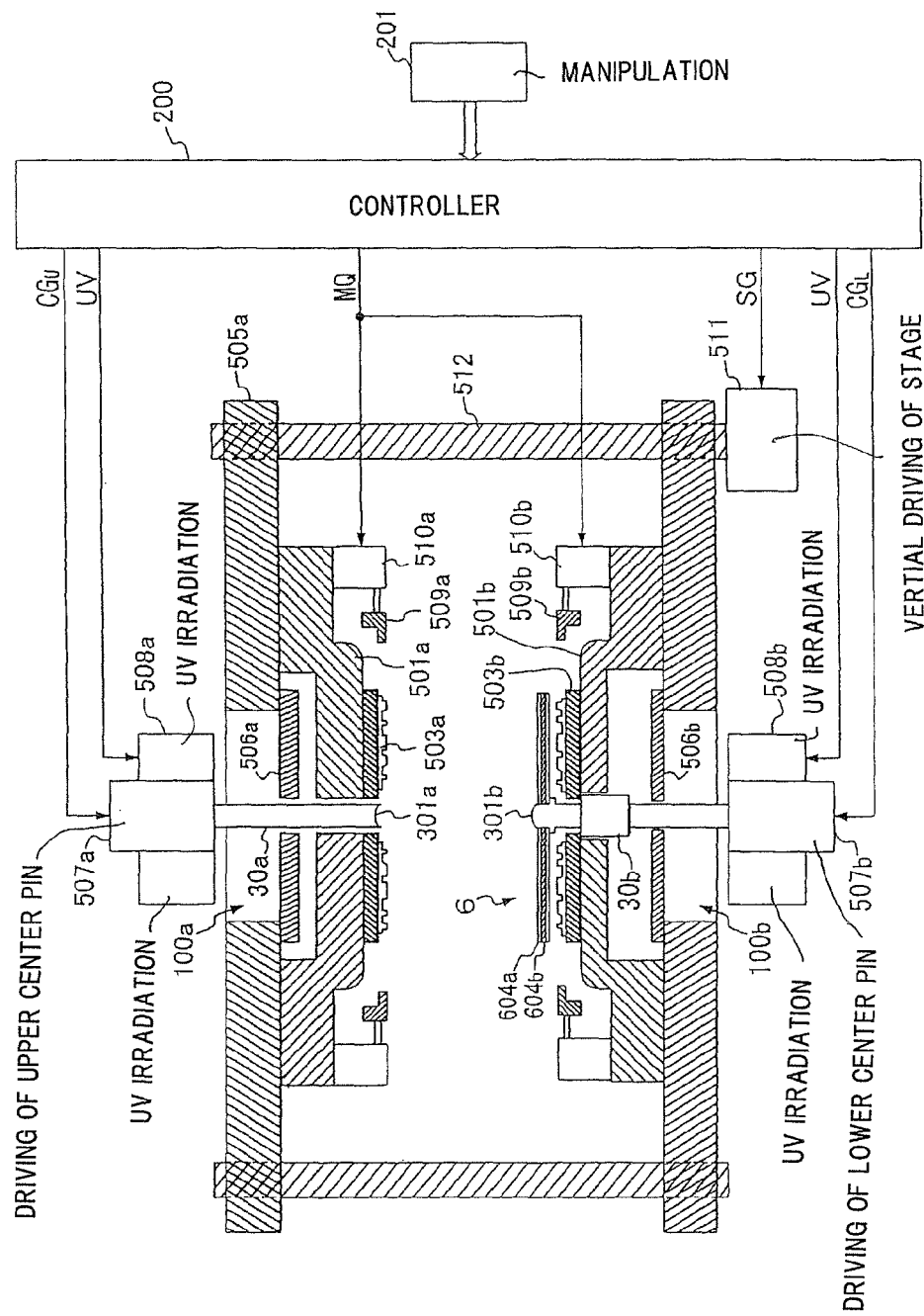
FIG. 1 illustrates a schematic construction of a nano-imprint apparatus using a mold according to the present invention.

DESCRIPTION OF REFERENCE NUMERALS 6, 16 Substrates
30a Upper Center Pin
30b Lower Center Pin
200 Controller
501a Upper Mold Holding Part
501b Lower Mold Holding Part
503a Upper Mold
503b Lower Mold
507b Lower Center Pin Drive Unit
511 Vertical Stage Drive Unit Embodiment(s)

Hereinafter, an embodiment of the present invention will be described in detail with reference to the accompanying drawings.

FIG. 1 is a cross sectional view illustrating the schematic construction of an ultraviolet (UV) type nano-imprint apparatus that performs transfer using a mold according to the present invention.

The nano-imprint apparatus simultaneously transfers patterns to opposite faces of a substrate 6 using an upper mold 503a having an uneven pattern to be transferred and a lower mold 503b having another uneven pattern to be transferred. The upper mold 503a and the lower mold 503b constitute a mold set. The substrate 6 is a circular or disk-shaped substrate, for example a magnetic disk substrate. The substrate 6 has a hole at the center thereof. The substrate 6 is made of a material, such as tempered glass, and it is an aluminum substrate or silicon wafer, for example. An upper transfer layer 604a and lower transfer layer 604b, both made of a material which is cured when ultraviolet rays are irradiated thereto, are provided on the opposite faces of the substrate 6. The upper and lower molds 503a and 503b are made of a base material, such as quartz or glass, exhibiting ultraviolet transmission. An uneven pattern is formed at the main surface of each of the upper and lower molds 503a and 503b.

Figure 2:
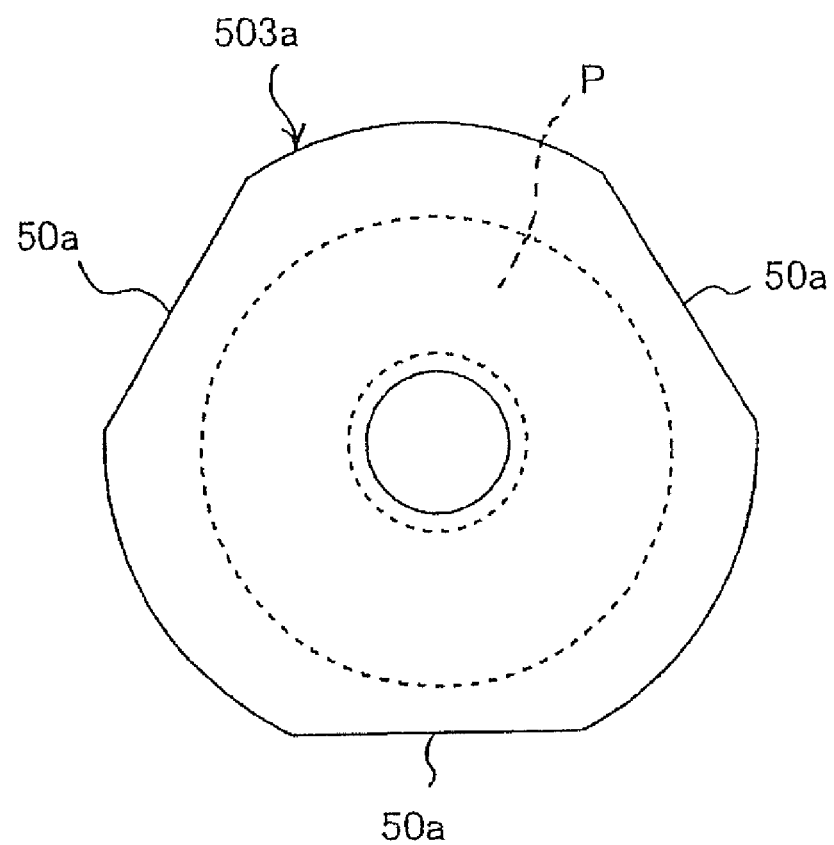
FIG. 2 is a plan view of an upper mold of the apparatus shown in FIG. 1.

As depicted in FIG. 2, the upper mold 503a is formed in a disk (or circular) shape having a size greater than the substrate 6. The upper mold 503a has a hole at the center thereof. In FIG. 2, a portion P defined by the dotted line is an uneven pattern formation area of the upper mold 503a. The diameter of the center hole of the upper mold 503a is slightly greater than that of the center hole of the substrate 6.

In addition, the upper mold 503a is provided with three cutout parts 50a at the outer circumference of the disk shape. The three cutout parts have the same width and are arranged at equal intervals (intervals of 120 degrees). That is, the three cutout parts 50a are symmetric with respect to the center point of the upper mold 503a, and the cutout directions of the cutout parts 50a are normal to lines passing the center point of the upper mold 503a. In the same manner as the upper mold 503a, the lower mold 503b is formed in a disk shape. The lower mold 503b has a hole at the center thereof. The lower mold 503b is provided at the outer circumferential region thereof with three cutout parts 51b. In this embodiment, the upper mold 503a and the lower mold 503b are formed in the same shape, but it should be noted that the upper mold 503a and the lower mold 503b may be formed in other different shapes so long as portions other than the cutout parts are gripped by mold gripping parts 509a and 509b, and the mold gripping parts 509a and 509b do not interfere with each other.

FIG. 1 illustrates the construction of the nano-imprint apparatus in which the substrate 6 having the upper transfer layer 604a and the lower transfer layer 604b formed thereon, and the upper mold 503a and the lower mold 503b are mounted.

The nano-imprint apparatus shown in FIG. 1 includes an upper mechanism unit, a lower mechanism unit, a controller 200 to control the upper and lower mechanism units, and a manipulation unit 201.

The upper mechanism unit includes an upper center pin 30a, an upper mold holding part 501a, an upper stage 505a, an upper center pin support part 506a, an upper center pin drive unit 507a, an upper UV irradiation unit 508a, upper mold gripping parts 509a and upper mold gripper driving units 510a.

As shown in FIG. 1, an opening 100a and screw holes having female threads are formed in the upper stage 505a. The screw holes receive ball screws 512 (will be described below). The upper stage has a board-like shape. The upper center pin drive unit 507a and the upper UV irradiation unit 508a are disposed on the top of the upper stage 505a. On the other hand, the upper mold holding part 501a, having a mold holding surface (in FIG. 1, a surface which the upper mold 503a is in contact with) to fix and hold the upper mold 503a, and the upper center pin support part 506a are disposed at the bottom of the upper stage 505a. The upper center pin support part 506a is disposed in the opening 100a of the upper stage 505a. The upper center pin support part 506a has a through hole, which supports the upper center pin 30a such that the upper center pin 30a is movable upward and downward in the direction perpendicular to the mold holding surface of the upper mold holding part 501a.

The upper center pin drive unit 507a moves the upper center pin 30a upward or downward in the direction perpendicular to the mold holding surface of the upper mold holding part 501a according to an upper center pin movement signal $CG_U$ supplied from the controller 200. The upper UV irradiation unit 508a irradiates ultraviolet rays onto the upper transfer layer 604a of the substrate 6 via the opening 100a of the upper stage 505a according to an ultraviolet irradiation signal UV provided from the controller 200. Thus, the ultraviolet rays cure a transfer layer material of the upper transfer layer. The upper mold 503a is fixed to the mold holding surface of the upper mold holding part 501a by the upper mold gripping parts 509a. The mold holding surface of the upper mold holding part 501a has a through hole, through which the upper center pin 30a extends. The upper mold gripper drive units 510a are attached to the upper mold holding part 501a. The upper mold gripper drive units 510a drive the respective upper mold gripping parts 509a according to a mold gripping signal MQ sent from the controller 200 so that arc portions (that is, portions to be gripped) defined between the three cutout parts 50a formed at the outer circumference of the upper mold 503a can be gripped by three upper mold gripping parts 509a (in FIG. 1, only two of the upper mold gripping parts are shown). Each gripping part 509a has an L shape.

A depression 301a is formed at the lower end of the upper center pin 30a.

The lower mechanism unit includes a lower center pin 30b, a lower mold holding part 501b, a lower stage 505b, a lower center pin support part 506b, a lower center pin drive unit 507b, a lower UV irradiation unit 508b, lower mold gripping parts 509b, lower mold gripper drive units 510b, a vertical stage drive unit 511 and ball screws 512.

As shown in FIG. 1, an opening 100b and screw holes having female threads, into which the ball screws 512 are threadedly engaged, are formed in the lower stage 505b. The lower stage has a board-like shape. One end of each of the ball screws 512 is threadedly engaged into a corresponding one of the screw holes of the lower stage 505b and the other end of each of the ball screws 512 is threadedly engaged into a corresponding one of the screw holes of the upper stage 505a so that the ball screws 512 connect the lower stage 505b and the upper stage 505a to each other and the lower stage 505b and the upper stage 505a extend in parallel to each other. The lower mold holding part 501b, having a mold holding surface (in FIG. 1, a surface which the lower mold 503b is in contact with) to fix and hold the lower mold 503b, and the lower center pin support part 506b are disposed at the top of the lower stage 505b. On the other hand, the lower center pin drive unit 507b, the lower UV irradiation unit 508b and the vertical stage drive unit 511 are disposed at the bottom of the lower stage 505b.

The lower center pin support part 506b is disposed in the opening 100b of the lower stage 505b. The lower center pin support part 506b has a through hole, in which the lower center pin 30b is supported such that the lower center pin 30b is movable upward and downward in the direction perpendicular to the mold holding surface of the lower mold holding part 501b.

The center axes of the upper center pin 30a and the lower center pin 30b extend along the same straight line. The lower center pin 30b is provided at the upper end thereof with a protrusion 301b, which is formed in a hemispherical shape or in a conical shape. The protrusion 301b serves as a clamp mechanism together with the depression 301a formed at the lower end of the upper center pin 30a. The lower center pin 30b has a flange 504b in the vicinity of the upper end thereof. The diameter of the flange 504b is smaller than that of the center hole of the lower mold 503b and is greater than that of the center hole of the substrate 6.

The lower mold gripper drive units 510b are disposed at the lower mold holding part 501b. The lower mold gripper drive units 510b drive the respective lower mold gripping parts 509b according to a mold gripping signal MQ provided from the controller 200 so that arc portions (i.e., portions to be gripped) defined between the cutout parts 51b of the lower mold 503b can be gripped by the three L-shaped lower mold gripping parts 509b (in FIG. 1, only two of the lower mold gripping parts are shown).

In FIG. 1, the upper mold gripping parts 509a to grip the upper mold 503a and the lower mold gripping parts 509b to grip the lower mold 503b are disposed at the same angular positions about the centers of the upper center pin 30a and the lower center pin 30b. In actuality, however, an angular difference of 60 degrees occurs between the upper mold gripping parts and the lower mold gripping parts.

In order to operate the nano-imprint apparatus, the manipulation unit 201 receives various operation commands from a user and provides operation command signals representing the respective operation commands to the controller 200. The controller 200 executes a process program corresponding to the operation represented by the operation command signals supplied from the manipulation unit 201 and generates various control signals UV, $CG_U$ and $CG_L$ to control the nano-imprint apparatus.

Figure 3:
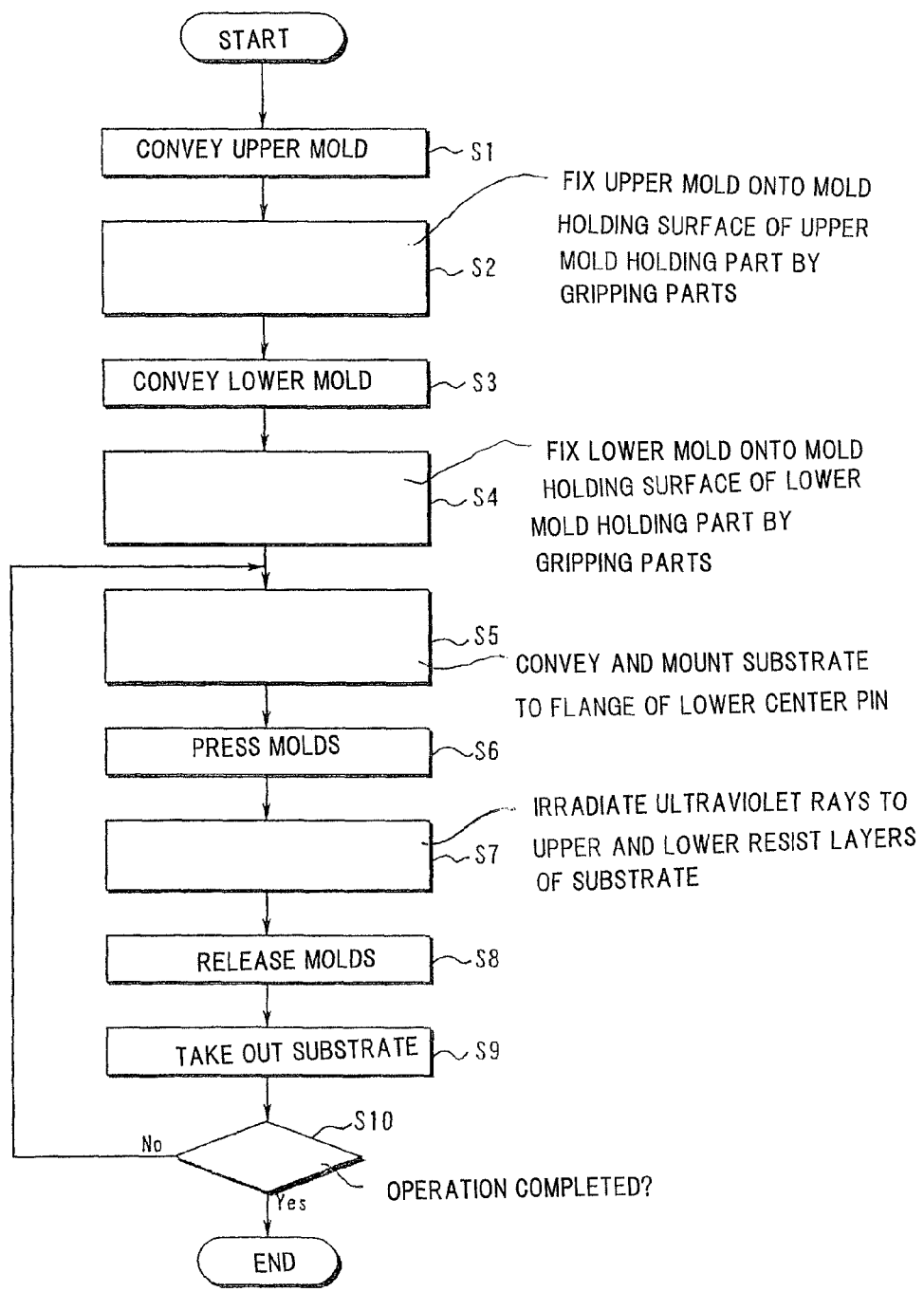
FIG. 3 is a flow chart of a nano-imprint process that is carried out by the apparatus shown in FIG. 1.

When the manipulation unit 201 receives an nano-imprint execution command from a user, the controller 200 starts the execution of a nano-imprint process program as shown in FIG. 3.

Referring to FIG. 3, first, the controller 200 causes a conveyance apparatus (not shown) to convey the upper mold 503a onto the mold holding surface of the upper mold holding part 501a (Step S1). After conveyance of the upper mold, the controller supplies a mold gripping signal MQ to the upper mold holder drive units 510a (Step S2). As the result of the execution of Step S2, the upper mold holder drive units 510a drive the respective upper mold gripping parts 509a, and the upper mold gripping parts 509a fix the upper mold 503a to predetermined upper holding positions on the mold holding surface of the upper mold holding part 501a by clamping the upper mold 503a with the upper mold gripping parts 509a from the opposite sides thereof. The predetermined upper holding positions are positions at which the upper center pin 30a can move through the center hole of the upper mold 503a while not being in contact with the inner wall of the center hole of the upper mold 503a.

Subsequently, the controller 200 causes the conveyance apparatus to convey the lower mold 503b onto the mold holding surface of the lower mold holding part 501b (Step S3). After conveyance of the lower mold, the controller supplies a mold gripping signal MQ to the lower mold holder drive units 510b (Step S4). As the result of the execution of Step S4, the lower mold holder drive units 510b drive the respective lower mold gripping parts 509b, and the lower mold gripping parts 509b fix the lower mold 503b to predetermined lower holding positions on the mold holding surface of the lower mold holding part 501b by clamping the lower mold 503b with the lower mold gripping parts 509b from the opposite sides thereof. The predetermined lower holding positions are positions at which the lower center pin 30b can move through the center hole of the lower mold 503b while not being in contact with the inner wall of the center hole of the lower mold 503b. The predetermined lower holding positions and the predetermined upper holding positions are vertically symmetric.

It should be noted that the upper mold 503a may be attached to the mold holding surface of the upper mold holding part 501a using a suction force from a vacuum pump instead of being fixed by the gripping parts 509a and 509b. Likewise, the lower mold 503b may be attached to the mold holding surface of the lower mold holding part 501a by a suction force.

Subsequently, the controller 200 causes the conveyance apparatus to convey the substrate 6 in order to mount the substrate 6 to the flange 504b of the lower center pin 30b (Step S5). Specifically, the lower center pin 30b is inserted into the center hole of the substrate 6, the substrate 6 is moved along the upper end protrusion 301b of the lower center pin 30b and then placed on the flange 504b. As a result, the positional alignment of the substrate 6 with the molds 503a and 503b, which are fixedly held as described above, is achieved.

After the installation of the substrate 6, the controller 200 implements the mold pressing (Step S6). In order to press the molds, a stage drive signal SG to move the upper stage 505a downward is sent to the vertical stage drive unit 511, and an upper center pin movement signal $CG_U$ to move the upper center pin 30a downward is sent to the upper center pin drive unit 507a. As a result, the upper stage 505a is moved downward and the upper center pin 30a is moved downward. Thus, the depression 301a formed at the lower end of the upper center pin 30a is coupled to the protrusion 301b of the lower center pin 30b, and therefore, the upper mold 503a comes into contact with the upper transfer layer 604a of the substrate 6. As the upper stage 505a and the upper center pin 30a further move downward together with the upper mold 503a and the substrate 6, the lower center pin 30b is pressed down, and the lower transfer layer 604b of the substrate 6 comes into contact with the lower mold 503b. Since the opposite faces of the substrate 6 are pressed by the upper mold 503a and the lower mold 503b, the protruding parts of the upper mold 503a are pressed into the upper transfer layer 604a and, at the same time, the protruding parts of the lower mold 503b are pressed into the lower transfer layer 604b. Consequently, an uneven pattern reverse to the uneven pattern formed at the upper mold 503a is formed at the surface of the upper transfer layer 604a. On the other hand, an uneven pattern reverse to the uneven pattern formed at the lower mold 503b is formed at the surface of the lower transfer layer 604b. That is, as the result of the execution of Step S4, the patterns formed at the upper mold 503a and the lower mold 503b are simultaneously transferred to the upper transfer layer 604a and the lower transfer layer 604b of the substrate 6, respectively.

Figure 4:
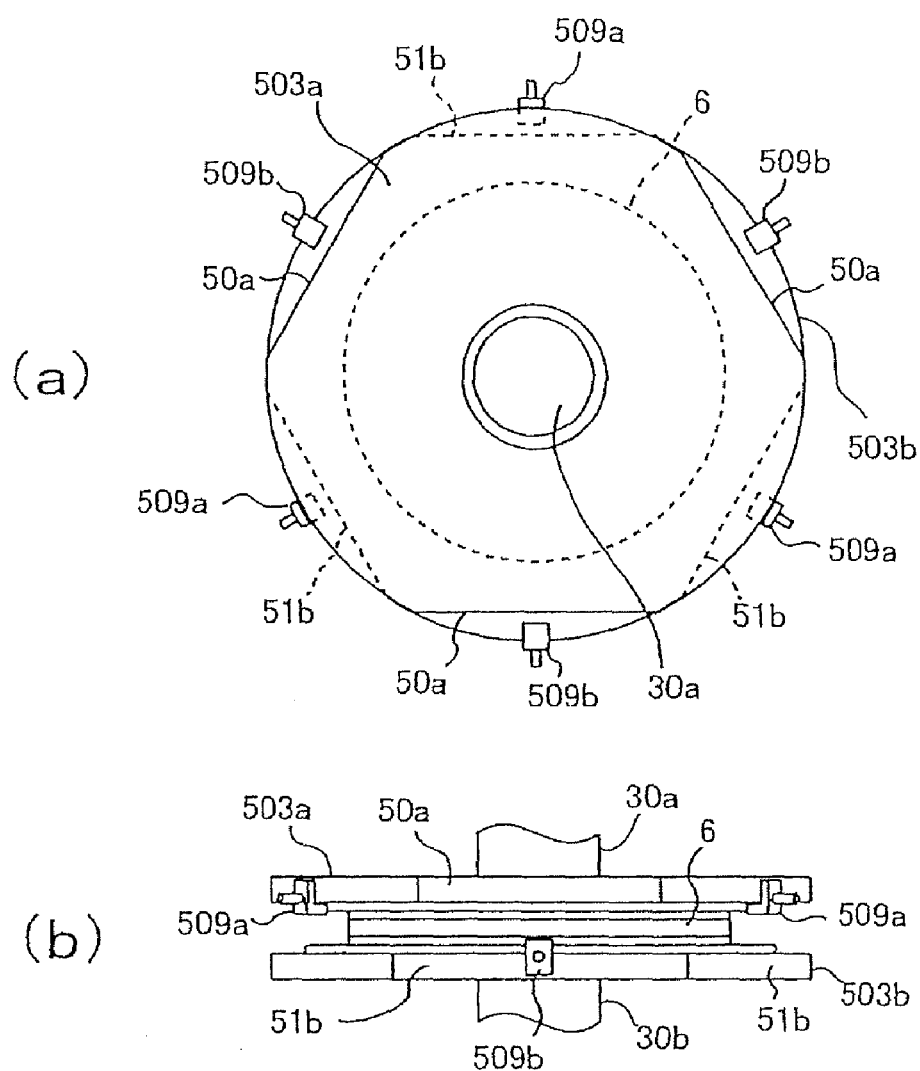
FIG. 4a is a plan view of the upper mold, a lower mold and a substrate during a mold pressing operation of the apparatus of FIG. 1.
FIG. 4b is a side view thereof.

During the mold pressing, as shown in FIGS. 4a and 4b, the upper mold gripping parts 509a to grip the upper mold 503a and the lower mold gripping parts 509b to grip the lower mold 503b do not overlap each other. Specifically, the upper mold gripping parts 509a and the lower mold gripping parts 509b are alternately arranged at 60-degree intervals about the center pins 30a and 30b, the upper mold gripping parts 509a grip the circular outer circumference portions other than the cutout parts 50a of the upper mold 503a, and the lower mold gripping parts 509b grip the circular outer circumference portions other than the cutout parts 51b of the lower mold 503b. Thus, the upper mold gripping parts 509a are placed within angles at which the cutout parts 51b of the lower mold 503b extend, and the upper mold gripping parts 509a do not overlap the outer circumferential portions of the lower mold 503b. Likewise, the lower mold gripping parts 509b are placed within angles at which the cutout parts 50a of the upper mold 503a extend, and the upper mold gripping parts 509a do not overlap the outer circumferential portions of the upper mold 503a. As a result, the cutout parts 50a and 51b deviate from the mold gripping parts 509b and 509a. During the pressing, therefore, interference, such as collisions between the upper mold gripping parts 509a and the lower mold gripping parts 509b in the pressing direction, collisions between the upper mold gripping parts 509a and the outer circumferential portions of the lower mold 503b in the pressing direction, or collisions between the lower mold gripping parts 509b and the outer circumferential portions of the upper mold 503a in the pressing direction, does not occur. Thus, it is possible to simultaneously press the upper mold 503a and the lower mold 503b to the opposite faces of the substrate 6.

Figure 5:
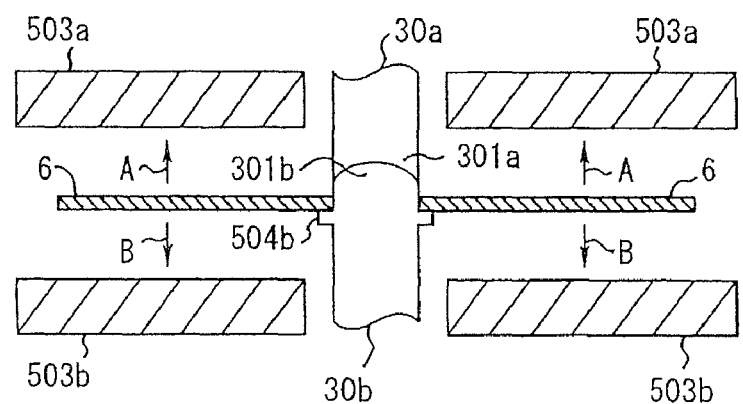
FIG. 5 illustrates the upper mold, the lower mold and the substrate during a mold releasing operation of the apparatus of FIG. 1.

After the execution of Step S4, the controller 200 provides an ultraviolet irradiation signal UV to the upper UV irradiation unit 508a and the lower UV irradiation unit 508b (Step S7). As the result of the execution of Step S7, the upper UV irradiation unit 508a irradiates ultraviolet rays to the upper transfer layer 604a of the substrate 6 so as to harden the transfer layer material of the upper transfer layer 604a, and the lower UV irradiation unit 508b irradiates ultraviolet rays to the lower transfer layer 604b of the substrate 6 so as to harden the transfer layer material of the lower transfer layer 604b. After the transfer layer material of the upper transfer layer 604a and the transfer layer material of the lower transfer layer 604b are hardened, the controller 200 performs a release operation to release the substrate 6 from the upper mold 503a and the lower mold 503b (Step S8). In order to perform the release operation, the controller 200 sends a stage drive signal SG to the vertical stage drive unit 511 so as to move the upper stage 505a upward by a predetermined distance. As a result, the upper mold 503a is spaced from the upper transfer layer 604a of the substrate 6 as indicated by arrows A in FIG. 5. In addition, an upper center pin movement signal $CG_U$ is supplied to the upper center pin drive unit 507a and, at the same time, a lower center pin movement signal $CG_L$ is supplied to the lower center pin drive unit 507b, so as to cause the upper center pin 30a and the lower center pin 30b to move upward, with the upper center pin 30a and the lower center pin 30b being engaged with each other. Consequently, the substrate 6 is lifted by the flange 504b of the lower center pin 30b in the direction indicated by the arrows A of FIG. 5, and the substrate 6 is released from the lower mold 503b as indicated by arrows B of FIG. 5.

After the mold releasing, the controller 200 supplies an upper center pin movement signal $CG_U$ to the upper center pin drive unit 507a so as to move the upper center pin 30a upward and supplies a command to the conveyance apparatus so as to separate the substrate 6 from the lower center pin 30b so that the substrate 6 is conveyed out by the conveyance apparatus (Step S9).

Subsequently, the controller 200 determines whether an operation command signal representing termination of the operation has been provided from the manipulation unit 201 (Step S10). When it is determined at Step S10 that the operation command signal for termination of the operation has been provided, then the controller 200 terminates the nano-imprint process program. On the other hand, when it is determined at Step S10 that the operation command signal for termination of the operation has not been provided, the procedure returns to Step S5 and the controller 200 repeats the operations of Steps S5 to S10. Consequently, pattern transfer is continuously performed with respect to a newly conveyed substrate 6.

Figure 6:
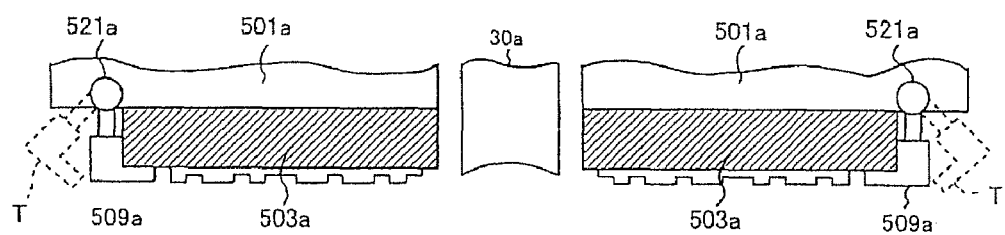
FIG. 6 illustrates another example of a mold gripping parts that can be used for the apparatus of FIG. 1.

In the nano-imprint apparatus of FIG. 1, the upper mold gripping parts 509a and the lower mold gripping parts 509b are configured to be movable from side to side. It should be noted, however, as shown in FIG. 6, that rotary shafts 521a may be mounted at the upper mold holding part 501a so that the upper mold 503a is held and fixed by the gripping parts 509b that are rotated about the rotary shafts 521a using drive units (not shown), and the gripping parts 509b may be placed at positions indicated by the broken lines T when the upper mold 503a is conveyed in and conveyed out. This is equally applicable to the lower mold 503b.

Figure 7:
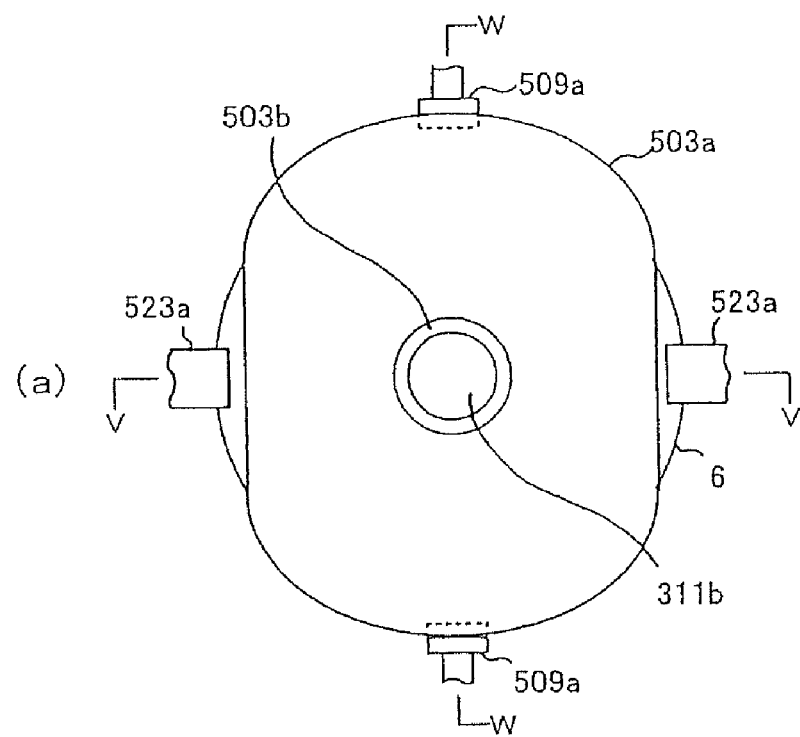
FIGS. 7a to 7c illustrate the fixedly supported state of a mold and a substrate during mold pressing in another embodiment of the present invention, and particularly
Figure 7:
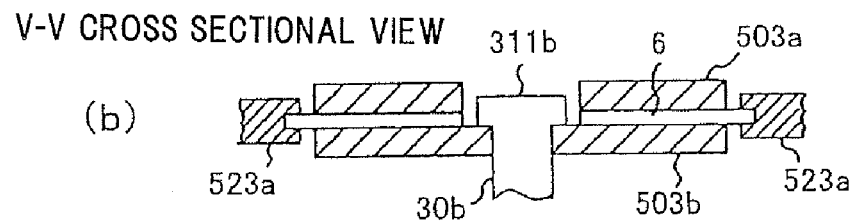
Figure 7:
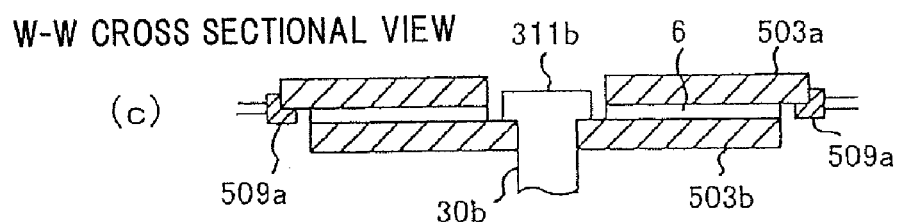

In the nano-imprint apparatus of FIG. 1, the substrate 6 is supported by the upper center pin 30a and the lower center pin 30b. As shown in FIGS. 7a to 7c, however, it should be noted that the opposite sides of the outer circumferential part of the substrate 6 may be held between two arm support members 523a each having a depression at the end thereof. In this configuration, the lower mold 503b is formed in a circular shape slightly smaller than the upper mold 503a and is fixed at the end of the lower center pin 30b by a fixing member 311b. The upper center pin 30a in the nano-print apparatus of FIG. 1 is not provided. Also, the upper mold 503a and the lower mold 503b are fixed so that the cutout parts 50a of the upper mold 503a and the cutout parts 51b of the lower mold 503b are placed at the same angular positions. During pressing, therefore, the cutout parts 50a and the cutout parts 51b provide an escape, in particular as shown in FIG. 7b. Thus, the arm support members 523a do not overlap the upper mold 503a and the lower mold 503b.

In the above-described embodiment, two or three cutout parts 50a and 51b are formed in the upper mold 503a and the lower mold 503b, respectively. However, the number of the cutout parts is not particularly restricted so long as the number of the cutout parts is more than one. If the number of the cutout parts 50a and 51b of the upper mold 503a and the lower mold 503b is n, the cutout parts 50a and 51b are formed at angular intervals of 360 degrees/n. Preferably, n is 2 to 5.

In the above-described embodiment, the substrate 6, the upper mold 503a and the lower mold 503b are all formed in a disk shape. It should be noted here that the disk shape includes an elliptical shape.

In the above-described embodiment, nano-imprint is performed using ultraviolet rays. However, the mold according to the present invention may also be applied to a thermal imprint method of heating a substrate and a mold to transfer a pattern from the mold to the substrate. In this case, a material, such as nickel or silicon, which does not transmit UV rays may be used as a base material for the mold.

Also, in the above-described embodiment, uneven patterns are transferred to the opposite faces of the substrate. However, the mold according to the present invention may be used in a nano-imprint method that transfers an uneven pattern to only the transfer layer forming surface on one face of the substrate.

Figure 8:
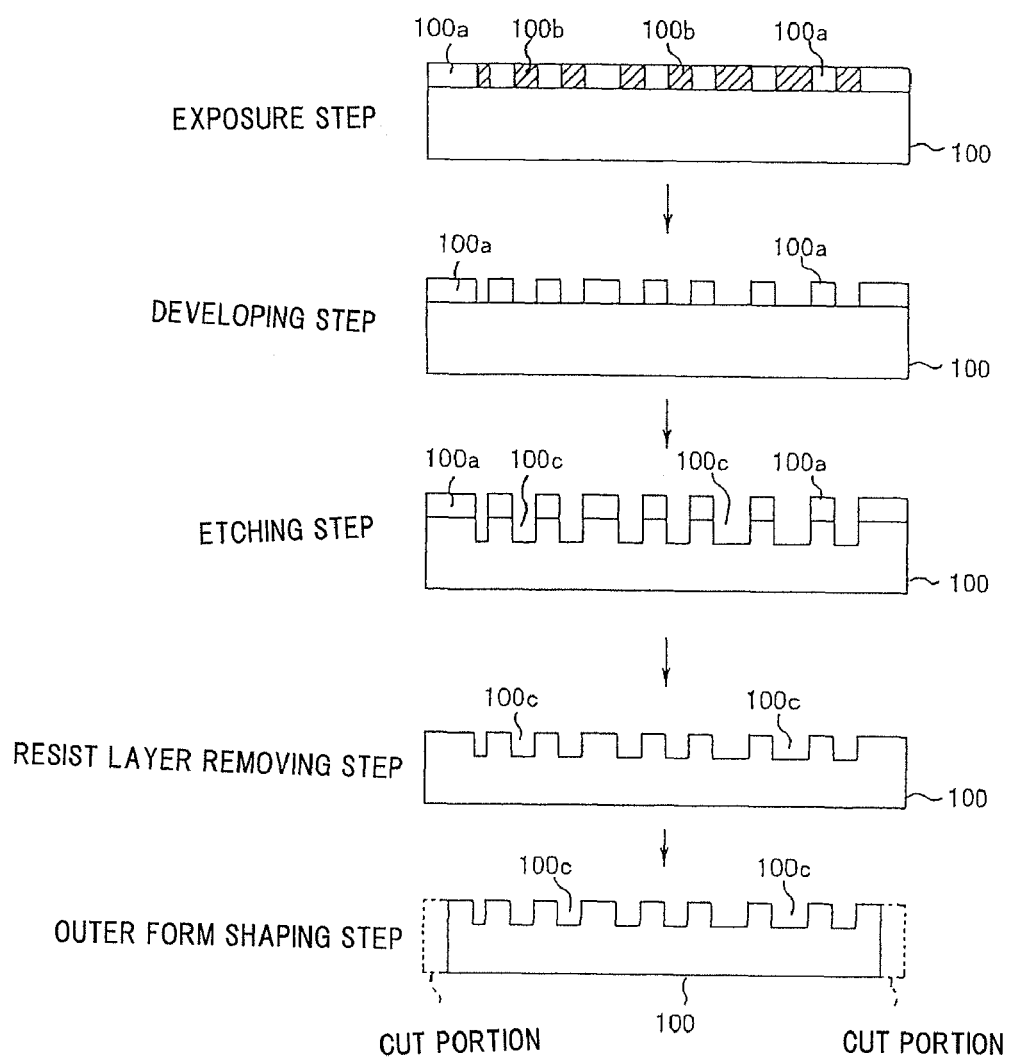
FIG. 8 illustrates a mold manufacturing method.

FIG. 8 illustrates an example of a mold manufacturing method to manufacture the upper mold 503a and the lower mold 503b. Hereinafter, the mold manufacturing method will be described with reference to FIG. 8. First, a circular quartz blank 100 having a resist layer 100a formed on the surface thereof is prepared. Electron beams from an electron beam lithography apparatus are irradiated to the resist layer 100a of the blank 100 from above to expose the resist layer 100a (exposure step). In the exposure step, for example, data patterns of a servo zone and a data zone for magnetic disks are formed in the resist layer 100a of the blank 100 as a latent image 100b by irradiation of electron beams to the blank. After the blank 100 is taken out from the electron beam recording apparatus, a developing step is performed with respect to the blank 100 (developing step). As the result of the developing step, the latent image 100b is removed. Subsequently, quartz etching is performed with respect to the quartz blank 100 to form depressed parts 100c in the quartz blank 100 (etching step). The resist layer 100a remaining after the etching step is removed (resist layer removing step). Consequently, an uneven pattern is formed in the surface of the quartz blank 100. Three portions of the outer circumferential region of the quartz blank 100 are cut as indicated by the broken lines in FIG. 8. Thus, a mold having cutout parts as shown in FIG. 2 is manufactured (outer form shaping step). This manufacturing method is equally applied to the upper mold 503a and the lower mold 503b.

It should be noted that the boundary lines of the cutout parts formed in the outer form shaping step may be drawn together with the data pattern through the irradiation of electron beams from the electron beam lithography apparatus in the exposure step. This may contribute to easy and accurate cutting of the outer circumference region in the outer form shaping step.

It should also be noted that the outer form shaping step may be performed before the exposure step, and that the exposure step, the developing step, the etching step and the resist layer removing step may be performed with respect to the blank 100 having the cutout parts.

In an alternative mold manufacturing method, a circular quartz blank (the one not shaped yet) having a UV curable resin formed on the surface thereof may be prepared, UV nano-imprint may be performed with respect to the UV curable resin on the surface of the quartz blank using a separately manufactured mold having an uneven pattern to manufacture a resin replica mold having the uneven pattern transferred to the UV curable resin thereof, and an outer form shaping step may be performed.

Alternatively, an outer form shaping step to create cutout parts at the outer circumferential region of a circular quartz blank may be performed, a UV curable resin may be formed on the surface of the quartz blank, and UV nano-imprint may be performed with respect to the UV curable resin using a separately manufactured mold having an uneven pattern to manufacture a resin replica mold having the uneven pattern transferred to the UV curable resin thereof.

It should be noted that the upper layer part of the substrate 6 may be used as the transfer layer so long as the substrate 6 is made of a material, such as resin film, bulk resin, or low melting-point glass, which can transfer the micro uneven patterns formed at the molds. This may allow a pattern to be directly transferred to the substrate 6.

The present invention may be used to manufacture various recording media, such as optical disks, in addition to pattern transfer to the magnetic disk.

What is claimed is:

1. A pair of molds for use in a transfer apparatus adapted to perform transferring patterns onto two transfer layers formed on opposite faces of an object as the two molds move toward each other to approach the corresponding transfer layers, wherein each said mold has a circular shape with three cutout parts each being defined by a straight line and said three cutout parts being formed at an outer circumferential region thereof at equal intervals, the outer circumferential region of each said mold except for the cutout parts is used as a portion to be gripped by a gripper of the transfer apparatus, and each said cutout part has a different shape from said portion to be gripped, the cutout parts of one of said two molds being adapted to receive the gripper of the transfer apparatus that grips the other of said two molds when the two molds move toward each other to approach the corresponding transfer layers.

2. The pair of molds according to claim 1, wherein said equal intervals are 120-degree intervals.

3. The pair of molds according to claim 1, wherein the three cutout parts of one of said two molds are spaced 60 degrees from the three cutout parts of the other of said two molds respectively when the two molds move toward each other to approach the corresponding transfer layers.

4. A method of manufacturing a pair of molds for use in a transfer apparatus adapted to perform transferring patterns onto two transfer layers formed on opposite faces of an object as the two molds move toward each other to approach the corresponding transfer layers, said method comprising:
preparing two mold blanks for said two molds, each said mold blank having a circular shape;
forming a pattern on each said mold blank; and
forming three cutout parts in each said mold blank by cutting an outer circumferential region of each said mold blank at three locations, each said cutout part being cut by a straight line, wherein those portions of the outer circumferential region other than the cutout parts are gripped by grippers of the transfer apparatus, and said those portions have a different shape from the cutout parts, said cutout parts of one of said two molds receiving those grippers of the transfer apparatus which grip the other of said two molds when the two molds move toward each other to approach the corresponding transfer layers.

5. The method according to claim 4, wherein the three cutout parts are spaced from each other at equal intervals.

6. The method according to claim 4, wherein the three cutout parts of one of said two molds are spaced 60 degrees from the three cutout parts of the other of said two molds respectively when the two molds move toward each other to approach the corresponding transfer layers.

* * * * *